United States Patent
Smith et al.

(10) Patent No.: US 10,933,718 B2
(45) Date of Patent: Mar. 2, 2021

(54) VEHICLE CONFIGURED TO PREVENT OIL ENTRAPMENT WITHIN REFRIGERANT SYSTEM AND CORRESPONDING METHOD

(71) Applicant: Ford Global Technologies, LLC, Dearborn, MI (US)

(72) Inventors: Mark G. Smith, Canton, MI (US); Timothy Noah Blatchley, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 141 days.

(21) Appl. No.: 16/413,649

(22) Filed: May 16, 2019

(65) Prior Publication Data
US 2020/0361288 A1 Nov. 19, 2020

(51) Int. Cl.
*B60H 1/32* (2006.01)
*F16K 17/04* (2006.01)
*H05K 7/20* (2006.01)

(52) U.S. Cl.
CPC .......... *B60H 1/3211* (2013.01); *F16K 17/048* (2013.01); *H05K 7/20881* (2013.01)

(58) Field of Classification Search
CPC . B60H 1/3211; F16K 17/048; F25B 2500/16; H05K 7/20881
USPC .......................................................... 62/204
See application file for complete search history.

(56) References Cited

U.S. PATENT DOCUMENTS

| | | | |
|---|---|---|---|
| 5,402,652 A * | 4/1995 | Alsenz | F25B 49/02 62/222 |
| 6,077,158 A | 6/2000 | Lake et al. | |
| 2005/0044879 A1* | 3/2005 | Ayub | F25B 43/02 62/470 |
| 2010/0010681 A1 | 1/2010 | Zugibe et al. | |
| 2010/0175396 A1* | 7/2010 | Lifson | F25B 49/02 62/115 |
| 2014/0144160 A1 | 5/2014 | Jackson | |
| 2015/0292776 A1* | 10/2015 | Tepas | F25B 5/02 62/117 |
| 2016/0047578 A1* | 2/2016 | Warren | F25B 13/00 62/115 |

(Continued)

OTHER PUBLICATIONS

Lefebvre, L. "Smart Battery Thermal Management for PHEV Efficiency," RHEVE 2011: International Conference on Hybrid and Electric Vehicles, Oil & Gas Science and Technology (OGST)—Rev. IFP Energies nourvelles, vol. 68, Published online Mar. 2013, No. 1, pp. 149-164.

(Continued)

*Primary Examiner* — Henry T Crenshaw
(74) *Attorney, Agent, or Firm* — David B. Kelley; Carlson, Gaskey & Olds, P.C.

(57) ABSTRACT

This disclosure relates to a vehicle configured to prevent oil entrapment within a refrigerant system of the vehicle. This disclosure also relates to a corresponding method. An example vehicle includes a refrigerant system configured to circulate fluid including a mixture of refrigerant and oil relative to an evaporator, a controller, and an electronic expansion valve upstream of the evaporator. The electronic expansion valve is responsive to instructions from the controller, and the controller is configured to instruct the electronic expansion valve to open to prevent entrapment of oil within the evaporator or refrigerant lines.

15 Claims, 3 Drawing Sheets

(56) References Cited

U.S. PATENT DOCUMENTS

2016/0159204 A1    6/2016   Katoh et al.
2017/0087957 A1    3/2017   Blatchley et al.
2018/0283753 A1*   10/2018   Das ........................ F25B 49/02
2019/0376730 A1*   12/2019   Sakae .................... F25B 43/02

OTHER PUBLICATIONS

Song, Bongha, Kwon, Jiwon and Kim, Yongsuk, "Air Conditioning System Sizing for Pure Electric Vehicle," EVS28 International Electric Vehicle Symposium and Exhibition, World Electric Vehicle Journal vol. 7—ISSN 2032-6653, Copyright 2015 WEVA, pp. WEVJ7-0407-0413.

* cited by examiner

VEHICLE CONFIGURED TO PREVENT OIL ENTRAPMENT WITHIN REFRIGERANT SYSTEM AND CORRESPONDING METHOD

TECHNICAL FIELD

This disclosure relates to a vehicle configured to prevent oil entrapment within a refrigerant system of the vehicle. This disclosure also relates to a corresponding method.

BACKGROUND

The desire to reduce automotive fuel consumption and emissions is well documented. Therefore, vehicles are being developed that reduce or completely eliminate reliance on internal combustion engines. Electrified vehicles are one type of vehicle currently being developed for this purpose. In general, electrified vehicles differ from conventional motor vehicles because they are selectively driven by one or more battery powered electric machines. Conventional motor vehicles, by contrast, rely exclusively on the internal combustion engine to drive the vehicle.

Automatic climate control is increasingly prevalent in motor vehicles today. In such vehicles, a user chooses a temperature setting, and a climate control system works to heat or cool a passenger cabin to meet the thermal conditioning demand. The climate control system may include a refrigerant system having a compressor, condenser, one or more expansion devices, and one or more evaporators. The refrigerant system may also be used to thermally condition a high voltage battery pack, which powers the electric machines and other electrical loads of an electrified vehicle.

SUMMARY

A vehicle according to an exemplary aspect of the present disclosure includes, among other things, a refrigerant system configured to circulate fluid relative to an evaporator, the fluid including a mixture of refrigerant and oil, a controller, and an electronic expansion valve upstream of the evaporator. The electronic expansion valve is responsive to instructions from the controller, and the controller is configured to instruct the electronic expansion valve to open to prevent entrapment of oil within the evaporator.

In a further non-limiting embodiment of the foregoing vehicle, the controller is configured to instruct the electronic expansion valve to open based on an oil entrapment prevention strategy.

In a further non-limiting embodiment of any of the foregoing vehicles, the refrigerant system includes a compressor responsive to instructions from the controller, and the controller is configured to instruct the compressor to continue operating when the electronic expansion valve is open.

In a further non-limiting embodiment of any of the foregoing vehicles, when the electronic expansion valve is open, the controller is configured to instruct the compressor to operate above a minimum threshold speed.

In a further non-limiting embodiment of any of the foregoing vehicles, the controller runs the oil entrapment prevention strategy by issuing instructions to open the electronic expansion valve and to operate the compressor above the minimum threshold speed at predefined intervals for a predefined period of time.

In a further non-limiting embodiment of any of the foregoing vehicles, the refrigerant system includes a pressure sensor downstream of the evaporator, and the controller is configured to interpret signals from the pressure sensor to determine a pressure of the fluid downstream of the evaporator.

In a further non-limiting embodiment of any of the foregoing vehicles, the refrigerant system includes a temperature sensor adjacent the evaporator, and the controller is configured to interpret signals from the temperature sensor to determine a temperature of the evaporator.

In a further non-limiting embodiment of any of the foregoing vehicles, the controller is configured to issue instructions to the electronic expansion valve based on the signals of the pressure sensor and the temperature sensor.

In a further non-limiting embodiment of any of the foregoing vehicles, the controller is configured to issue instructions to the electronic expansion valve such that the fluid is superheated downstream of the evaporator.

In a further non-limiting embodiment of any of the foregoing vehicles, the evaporator is a first evaporator and is configured to thermally condition a main section of a vehicle cabin, and the refrigerant system includes a second evaporator arranged in parallel with the first evaporator.

In a further non-limiting embodiment of any of the foregoing vehicles, the second evaporator is configured to thermally condition a rear section of a vehicle cabin.

In a further non-limiting embodiment of any of the foregoing vehicles, the refrigerant system includes a third evaporator in parallel with both the first evaporator and the second evaporator, and the third evaporator is configured to thermally condition a battery pack of the vehicle.

In a further non-limiting embodiment of any of the foregoing vehicles, the refrigerant system includes first, second, and third electronic expansion valves upstream of a respective one of the first, second, and third evaporators, and the controller is configured to instruct the first, second, and third electronic expansion valves to open based on an oil entrapment prevention strategy.

A method according to an exemplary aspect of the present disclosure includes, among other things, opening an electronic expansion valve upstream of an evaporator of a vehicle refrigerant system to prevent entrapment of oil within the evaporator.

In a further non-limiting embodiment of the foregoing method, the method includes operating a compressor of the vehicle refrigerant system above a minimum threshold speed when the electronic expansion valve is open.

In a further non-limiting embodiment of any of the foregoing methods, the compressor circulates fluid within the vehicle refrigerant system, the fluid including oil and refrigerant.

In a further non-limiting embodiment of any of the foregoing methods, the operating step includes one of (1) maintaining a speed of the compressor if the speed is above the minimum threshold speed, and (2) increasing the speed above the minimum threshold speed if the speed is not above the minimum threshold speed.

In a further non-limiting embodiment of any of the foregoing methods, the opening and operating steps are performed as part of an oil entrapment prevention strategy which differs from a normal control strategy of the vehicle refrigerant system.

In a further non-limiting embodiment of any of the foregoing methods, the opening and operating steps are performed for a predefined period of time and at predefined intervals.

In a further non-limiting embodiment of any of the foregoing methods, the opening and operating steps are performed during the predefined period of time regardless of whether the normal control strategy of the vehicle refrigerant system would otherwise require opening the electronic expansion valve or operating the compressor above the minimum threshold speed during the predefined period of time.

DETAILED DESCRIPTION

This disclosure relates to a vehicle configured to prevent oil entrapment within a refrigerant system of the vehicle. This disclosure also relates to a corresponding method. An example vehicle includes a refrigerant system configured to circulate fluid including a mixture of refrigerant and oil relative to an evaporator, a controller, and an electronic expansion valve upstream of the evaporator. The electronic expansion valve is responsive to instructions from the controller, and the controller is configured to instruct the electronic expansion valve to open to prevent entrapment of oil within the evaporator. This disclosure allows for direct control the expansion device, and thus permits a compressor of the refrigerant system to continue running during an oil entrapment prevention strategy, which thereby reduces or eliminates any changes to cabin temperature. This disclosure has a number of other benefits which will be appreciated from the following description.

Figure 1:
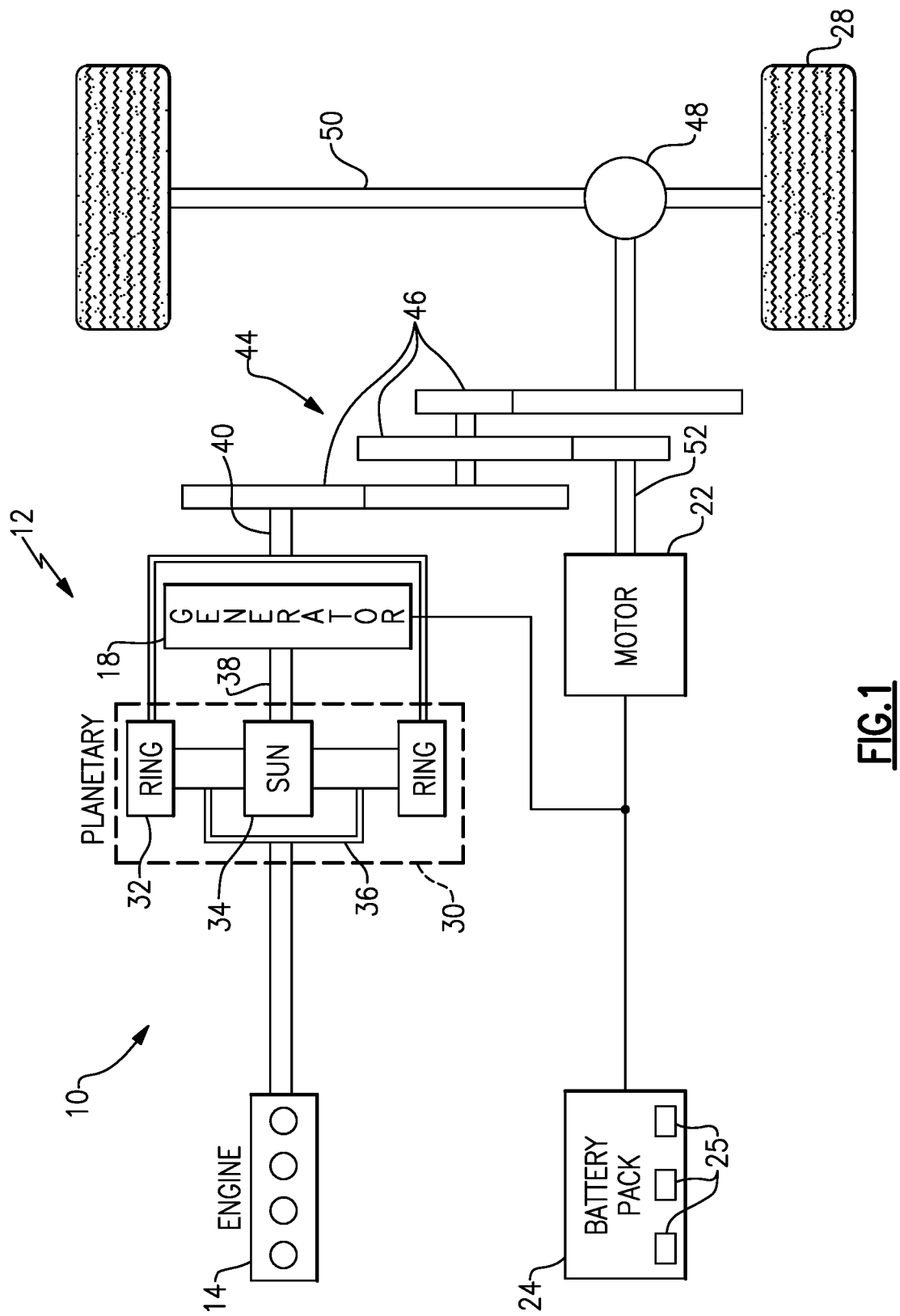
FIG. 1 schematically illustrates a powertrain of an electrified vehicle.

FIG. 1 schematically illustrates a powertrain 10 for an electrified vehicle 12 ("vehicle 12"). Although depicted as a hybrid electric vehicle (HEV), it should be understood that the concepts described herein are not limited to HEVs and could extend to other electrified vehicles, including, but not limited to, plug-in hybrid electric vehicles (PHEVs), battery electric vehicles (BEVs) and fuel cell vehicles (FCVs). This disclosure also extends to various types of hybrid vehicles including full hybrids, parallel hybrids, series hybrids, mild hybrids, micro hybrids, and plug-in hybrids. Further, certain embodiments of this disclosure are not limited to electrified vehicles, and extend to traditional motor vehicles driven solely by an internal combustion engine.

With continued reference to FIG. 1, the example powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the vehicle 12.

The engine 14, which in one embodiment is an internal combustion engine, and the generator 18 may be connected through a power transfer unit 30, such as a planetary gear set. Other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system. For example, the motor 22 and the generator 18 can each output electrical power to the battery pack 24.

The battery pack 24 is an exemplary electrified vehicle battery. The battery pack 24 may be a high voltage traction battery pack that includes a plurality of battery assemblies 25 (i.e., battery arrays or groupings of battery cells) capable of outputting electrical power to operate the motor 22, the generator 18 and/or other electrical loads of the vehicle 12. Other types of energy storage devices and/or output devices could also be used to electrically power the vehicle 12.

In one non-limiting embodiment, the vehicle 12 has two basic operating modes. The vehicle 12 may operate in an electric vehicle (EV) mode where the motor 22 is used (generally without assistance from the engine 14) for vehicle propulsion, thereby depleting the battery pack 24 state of charge (SOC) up to its maximum allowable discharging rate under certain driving patterns/cycles. The EV mode is an example of a charge depleting mode of operation for the vehicle 12. During EV mode, the state of charge of the battery pack 24 may increase in some circumstances, for example due to a period of regenerative braking. The engine 14 is generally OFF under a default EV mode but could be operated as necessary based on a vehicle system state or as permitted by the operator.

The vehicle 12 may additionally operate in a hybrid (HEV) mode in which the engine 14 and the motor 22 are both used for vehicle propulsion. The HEV mode is an example of a charge sustaining mode of operation for the vehicle 12. During the HEV mode, the vehicle 12 may reduce the motor 22 propulsion usage in order to maintain the state of charge of the battery pack 24 at a constant or approximately constant level by increasing the engine 14 propulsion. The vehicle 12 may be operated in other operating modes in addition to the EV and HEV modes within the scope of this disclosure.

Figure 2:
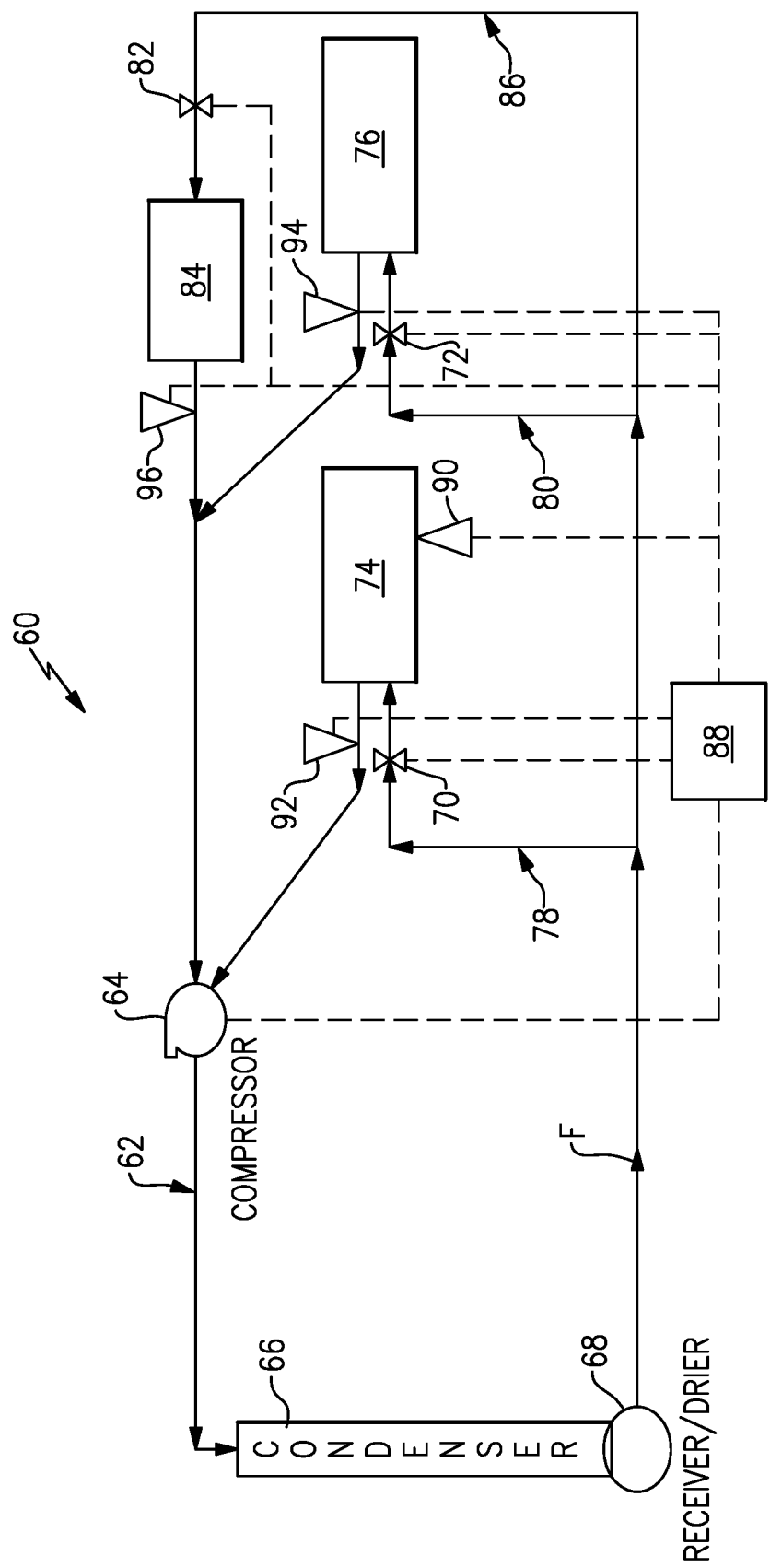
FIG. 2 schematically illustrates an example refrigerant system.

In addition to the components shown in FIG. 1, the vehicle 12 also includes a refrigerant system 60, as shown in FIG. 2. The refrigerant system 60 may be referred to herein as a vehicle refrigerant system, and may be part of an overall climate control system configured meet the various thermal conditioning demands of the vehicle 12. In this example, the refrigerant system 60 includes a main loop 62. The main loop 62 includes at least a compressor 64, a condenser 66 downstream of the compressor 64, a receiver-dryer 68, a first expansion device 70, a second expansion device 72, a first evaporator 74 downstream of the first expansion device 70, and a second evaporator 76 downstream of the second expansion device 72. The compressor 64 is configured to circulate fluid F within the main loop 62 within various passageways of the main loop 62. The second evaporator 76 may be referred to as a chiller in some applications.

In this example, the first expansion device 70 and the first evaporator 74 are arranged in parallel to the second expansion device 72 and the second evaporator 76. In particular, fluid F flowing through a first branch 78, which includes the first expansion device 70 and the first evaporator 74, flows from the condenser 66 to the compressor 64 in parallel to fluid F flowing through a second branch 80, which includes the second expansion device 72 and the second evaporator 76.

In one embodiment of this disclosure, the first evaporator 74 is an evaporator corresponding to a passenger cabin of the vehicle 12. In other words, the first evaporator 74 is configured to transfer thermal energy to or from a passenger cabin of the vehicle 12. The second evaporator 76 may be another cabin evaporator, such as a cabin evaporator configured to transfer thermal energy to or from a rear section of a passenger cabin of the vehicle 12. Alternatively, when the vehicle 12 is an electrified vehicle, the second evaporator 76 may be an evaporator configured to transfer thermal energy to or from a battery pack, such as the battery pack 24.

In yet another embodiment, the refrigerant system 60 may include a third expansion device 82 and a third evaporator 84 downstream of the third expansion device 82. The third expansion device 82 and third evaporator 84 are in a third branch 86, which is arranged parallel to the first and second branches 78, 80. In this embodiment, the first evaporator 74 may be configured to condition a main section of a passenger cabin, such as a front row and second row of seating, the second evaporator 76 may be configured to condition a rear section of a passenger cabin, such as a third row of seating, and the third evaporator 84 may be configured to condition the battery pack 24.

While several example arrangements have been described, this disclosure extends to other, differently-arranged refrigerant systems. To this end, as one would appreciate, the refrigerant system 60 includes a number of ducts, fans, valves, etc., which are not shown in FIG. 2.

The compressor 64 may be any known type of compressor, including a scroll compressor, centrifugal compressor, variable displacement compressor, etc., configured to increase the pressure of a flow of fluid F within the main loop 62. The fluid F within the main loop 62 includes a mixture of oil and refrigerant, which is sometimes called a lubricant-refrigerant mixture, a lubricant-refrigerant blend, or a blended refrigerant. The compressor 64 requires such a mixture of oil and refrigerant to ensure optimum performance. An example fluid F is a blended refrigerant known as R-410a. This disclosure extends to other such blended refrigerants, however.

In a particular aspect of this disclosure, the first expansion device 70, the second expansion device 72, and the third expansion device 82 (if present) are electronic expansion valves (EEVs or EXVs), as opposed to thermal expansion valves (TXVs). EEVs include a motor which is used to open and close a valve port. The valve port may include a threaded shaft on a needle valve or a modified ball valve. EEVs are used in this disclosure for a number of reasons, which will be appreciated from the below. Among them, EEVs are selectively opened to a number of positions (i.e., a number of intermediate positions and a fully open position) in response to instructions from a controller (discussed below). In this way, EEVs permit direct control of valve position by the controller. On the contrary, TXVs typically require certain components of the refrigerant system, such as the compressor, to be run in a modified state (e.g., turned off, or cycled on and then off) to generate a pressure differential sufficient to move the TXV to a desired position. Doing so may be noticeable by passengers in the cabin of the vehicle because it may reduce cabin cooling for a period of time, thereby increasing cabin temperature, as an example. The passengers may also notice additional noise from the refrigerant system as components are run in a modified state.

An example controller 88 is shown schematically in FIG. 2. The controller 88 is electrically connected to the first expansion device 70, the second expansion device 72, and the third expansion device 82 (if present), among other components of the refrigerant system 60, some of which will be discussed below. The controller 88 could be part of an overall vehicle control unit, such as a vehicle system controller (VSC), or could alternatively be a stand-alone control unit separate from the VSC, such as a battery control module. The controller 88 includes a combination of hardware and software, and includes various inputs and outputs for interfacing with the various components of the refrigerant system 60. The controller 88 additionally includes a processing unit and non-transitory memory for executing the various control strategies and modes of the refrigerant system 60. Although it is shown as a single device, the controller 88 may include multiple controllers in the form of multiple hardware devices, or multiple software controllers within one or more hardware devices. A controller area network (CAN) or local interconnect network (LIN), represented by the dashed lines in FIG. 2, allows the controller 88 to communicate with the various components of the refrigerant system 60.

The controller 88 is electrically connected to a number of sensors in this disclosure. The controller 88 is configured to interpret signals from the sensors to determine temperature or pressure quantities, as examples, associated with the sensors. The controller 88 is further configured to interpret the received information and issue instructions (i.e., commands) to various components of the refrigerant system 60 based on that information.

With reference to FIG. 2, the controller 88 is electrically connected to a temperature sensor 90 adjacent the first evaporator 74. In particular, the temperature sensor 90 may be any known type of temperature sensor configured to generate signals indicative of the temperature of the first evaporator 74. The temperature sensor 90 may be a fin probe sensor in one example, or arranged in an exiting air stream in another example. Further, the temperature sensor 90 may be directly mounted to the first evaporator 74. While a temperature sensor 90 is shown relative to the first evaporator 74 but not the other evaporators, it should be understood that the second and third evaporators 76, 84 may include temperature sensors similar to that shown relative to the first evaporator 74.

The controller 88 is also electrically connected to a pressure sensor 92 arranged downstream of the first evaporator 74. The pressure sensor 92 may be any known type of sensor configured to generate signals indicative of a pressure of the fluid F at the location of the sensor. The controller 88 is configured to interpret the signals from the pressure sensor 92 to determine a pressure of the fluid downstream of the first evaporator 74. Similar pressure sensors 94, 96 are arranged downstream of the second and third evaporators 76, 84, respectively. The pressure sensors 94, 96 are configured to generate signals indicative of the pressure of the fluid F at their respective locations, and the controller 88 is configured to interpret those signals. In addition to pressure, the sensors 92, 94, 96 may also generate signals indicative of the temperature of the fluid F at the respective sensor locations.

A normal control strategy for the refrigerant system 60 will now be described. In the normal control strategy, low pressure, low temperature fluid F that is in vapor state is communicated from the first evaporator 74, the second evaporator 76, and the third evaporator 84 (if present) to the compressor 64. The compressor 64 compresses the fluid F into a high pressure, high temperature vapor which is then sent to the condenser 66. The high pressure, high temperature vapor fluid F is passed through the condenser 66, which includes a coil. A fan directs ambient air across the coil to transfer heat from the high pressure, high temperature vapor fluid F to the ambient air blowing across the coil.

The fluid F exiting the condenser 66 is a high pressure, high temperature liquid that may then enter the receiver-dryer 68, which serves as a filter to remove any moisture and contaminants within the main loop 62. For example, the receiver-dryer 68 may include a desiccant for removing moisture from the fluid F. In an embodiment, the condenser 66 and the receiver-dryer 68 are combined into a single unit. However, these components could alternatively be separate from one another.

After exiting the condenser 66, the high pressure, high temperature liquid fluid F is directed to the first evaporator 74, the second evaporator 76, and/or the third evaporator 84 (if present) based on the positions of the expansion devices 70, 72, 82. The expansion devices 70, 72, 82 are adapted to change the pressure of the fluid F.

In one embodiment, when they are at least partially open, the expansion devices 70, 72, 82 are adapted to reduce the pressure of the fluid F that passes therethrough. Therefore, high pressure fluid F that exits the expansion devices 70, 72, 82 exhibits a lower pressure and is in the form of a liquid and vapor mixture, for example.

The first expansion device 70 regulates the amount of fluid F entering the first evaporator 74. For example, in one non-limiting embodiment, if the temperature of the fluid F exiting the first evaporator 74 is too hot, as determined based on signals from the sensor 92, the first expansion device 70 incrementally opens to allow more fluid F to flow into the first evaporator 74. Alternatively, if the temperature of the fluid F exiting the first evaporator 74 is too cold, the first expansion device 70 incrementally closes, thereby reducing the amount of fluid F flowing into the first evaporator 74. The second expansion device 72 and the third expansion device 82 (if present) work in a similar way to regulate the amount of fluid F entering the second evaporator 74 and, if present, the third evaporator 84, respectively.

The fluid F exiting the expansion devices 70, 72, 82 is a low pressure, low temperature liquid and vapor mixture that then enters the respective evaporator 74, 76, 84. A fan can be associated with each of the evaporators 74, 76, 86. The fans blow air across the evaporators 74, 76, 84 to reject heat to the fluid F. As such, the fluid F exiting the evaporators 74, 76, 84 is a low pressure, low temperature superheated vapor that flows back to the compressor 64. This refrigeration cycle may then repeat itself.

During the normal control strategy of the refrigeration system 60, it is possible for oil to separate out of the fluid F and accumulate in one or more of the evaporators 74, 76, 84 and/or the associated air conditioning lines attached to the respective evaporators. Separation and accumulation of oil may tend to occur when one or more of the evaporators 74, 76, 84 has not been used for a period of time, for example. Such separation and accumulation is undesired because it changes the effective oil-to-refrigerant ratio in the fluid F passing through the compressor 64, thereby providing a less than optimal amount of oil to the compressor 64. In turn, the compressor 64 may not run efficiently.

In this disclosure, the controller 88 is configured to instruct the electronic expansion devices 70, 72, 82 to open to prevent entrapment of oil within a respective one of the evaporators 74, 76, 84. In particular, the controller 88 is configured to run an oil entrapment prevention strategy, in which the controller 88 issues instructions to the various components of the refrigerant system 60 to prevent entrapment of oil within the evaporators 74, 76, 84 and the associated air conditioning lines, and/or to remove (i.e., purge) any entrapped oil within the evaporators 74, 76, 84 and associated lines.

The oil entrapment prevention strategy is programmed into the controller 88 in this example. The oil entrapment prevention strategy deviates from the normal control strategy of the refrigerant system 60. In one example, the oil entrapment prevention strategy includes a predefined set of instructions which the controller 88 issues to the various components of the refrigerant system 60, such as the expansion devices 70, 72, 82 and the compressor 64, for a predefined period of time and at predefined intervals. In other words, the controller 88 may enact the oil entrapment prevention strategy after the refrigerant system 60 has been running for a predefined period of time, such as 20 minutes, or for a predefined number of cycles. The controller 88 may run the oil entrapment prevention strategy more or less frequently based on real time operating conditions, including conditions of the refrigerant system 60, the vehicle 12, and/or ambient conditions surrounding the vehicle 12.

The oil entrapment prevention strategy may last for a relatively short period of time, such as 15 or 30 seconds, sufficient to prevent accumulation of oil within the evaporators 74, 76, 84 and/or to purge any accumulated oil within the evaporators 74, 76, 84 or refrigerant lines. In one example, the oil entrapment prevention strategy runs for a predefined period of time. In another example, the oil entrapment prevention strategy is not run for a predefined period of time, but rather the controller 88 interprets signals from the various sensors of the refrigerant system 60 to determine that it is no longer necessary to run the oil entrapment prevention strategy. In a particular example, the controller 88 runs the oil entrapment prevention strategy until the signals from the sensors indicate that the fluid F exiting the evaporators 74, 76, 84 is superheated, which indicates that it is no longer necessary to run the oil entrapment prevention strategy.

In one aspect of this disclosure, the controller 88 runs the oil entrapment prevention strategy relative each of the evaporators 74, 76, 84 simultaneously. In another example, the controller 88 runs the oil entrapment prevention strategy relative to the evaporators 74, 76, 84, one after the other, in series. In that example, the controller 88 would issue various instructions sufficient to ensure that oil was not entrapped within the first evaporator 74, and then issue similar instructions relative to the second evaporator 76, and finally to relative to the third evaporator 84 (if present). In a further example, the controller 88 runs the oil entrapment prevention strategy only relative to the particular evaporator or evaporators 74, 76, 84 that are exhibiting signs of potential oil entrapment. Such indicators may be based on information from the various sensors of the refrigerant system 60 or based on other factors, such as a period of time the evaporator has been running at a low load or not used at all, as examples.

Figure 3:
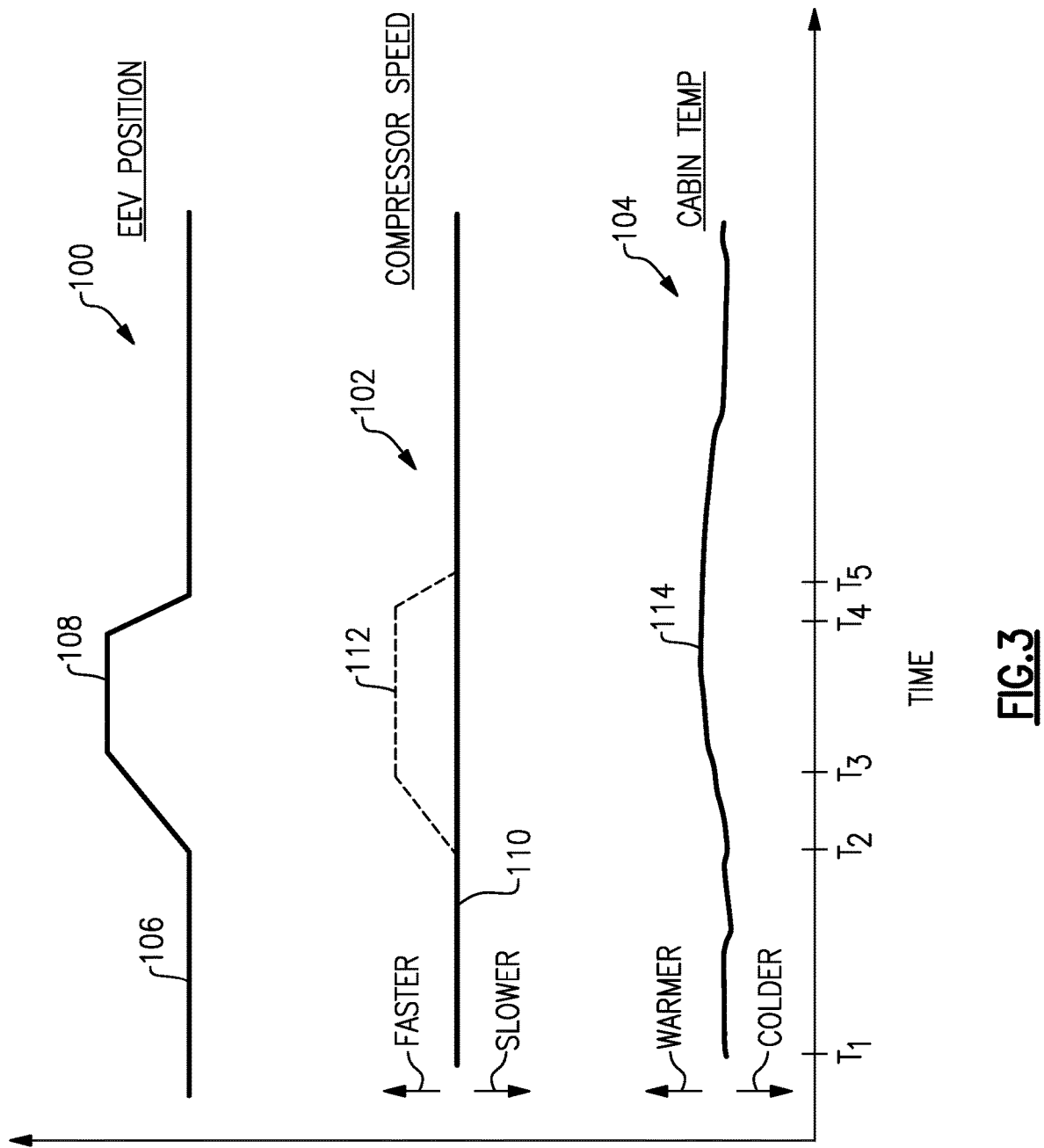
FIG. 3 graphically represents certain aspects of the refrigerant system as they are used in an example method.

An example oil entrapment prevention strategy will now be described with reference to FIG. 3, which graphically represents certain aspects of the refrigerant system 60, and with continued reference to FIG. 2. FIG. 3 is a graphical representation of three aspects of the refrigerant system 60 relative to time, which is on the x-axis. The x-axis in FIG. 3 is not necessarily to scale. In particular, FIG. 3 illustrates a first graphic 100, which is representative of a position of one of the expansion devices 70, 72, 82, a second graphic 102, which is representative of a speed of the compressor 64, and a third graphic 104, which is representative of a temperature of a passenger cabin of the vehicle 12.

The example oil entrapment prevention strategy represented in FIG. 3 begins at time $T_1$. At time $T_1$, the controller 88 may have identified conditions indicative of oil entrapment within one or more of the evaporators 74, 76, 84. Alternatively, time $T_1$ is representative of a time that controller 88 is programmed to initiate the oil entrapment prevention strategy based on a predefined interval having lapsed.

At time $T_1$, the controller 88 issues instructions to one or more of the expansion devices 70, 72, 82 to open the respective expansion devices 70, 72, 82 from a closed position, represented by line segment 106, to a predefined open position, represented by line segment 108. The respective expansion devices 70, 72, 82 begin moving to the predefined open position 108 at time $T_2$ and reach the predefined open position at time $T_3$. The predefined open position may be a position between a fully closed position and a fully open position, and may be sufficient to allow fluid F to flow through the respective evaporator 74, 76, 84 to prevent oil entrapment and/or to purge any entrapped oil.

At time $T_1$ the controller 88 also issues instructions to the compressor 64. In particular, the controller 88 issues instructions that permit the compressor 64 to continue operating when the respective expansion device 70, 72, 82 is open. In particular, the controller 88 is configured to instruct the compressor 64 to operate above a minimum threshold speed during the oil entrapment prevention strategy. In FIG. 3, the compressor 64 is running at a first speed, represented by solid line 110, which is above the minimum threshold speed. Thus, the compressor 64 maintains a constant speed during the duration of the oil entrapment prevention strategy. In another example, the speed represented by line 110 is below the minimum threshold speed. In that example, the controller 88 instructs the compressor 64 to increase its speed at time $T_2$. In FIG. 3, the speed of the compressor 64 begins increasing at time $T_2$ until it reaches a second speed at time $T_3$, represented by dashed line segment 112, which is above the minimum threshold speed. The compressor 64 continues to run above the minimum threshold speed for the duration of the oil entrapment prevention strategy.

In this example, the respective expansion devices 70, 72, 82 are opened and the compressor 64 is run above a minimum threshold speed during the oil entrapment prevention strategy regardless of whether the normal control strategy would have otherwise required opening the electronic expansion devices 70, 72, 82 or operating the compressor 64 above the minimum threshold speed during the same period of time. Opening the respective expansion devices 70, 72, 82 while continuing to run the compressor 64 from time $T_3$ to $T_4$ allows for fast and effective prevention of oil entrapment and/or purging of entrapped oil, and does so while significantly limiting if not completely preventing passenger discomfort. In particular, because the compressor 64 continues to run, the evaporators that are not subject to the oil entrapment prevention strategy continue to run normally. For instance, if the first evaporator 74 is subject to the oil entrapment prevention strategy, the second evaporator 76 continues to run normally, and vice versa. As shown in the third graphic 106, the temperature of the passenger cabin, represented by line segment 114, increases very gradually, and only slightly, from times $T_2$ to $T_4$ (and thereafter) such that the change is essentially imperceptible to passengers. In some other examples, there is even less of a change in cabin temperature, and in some particular examples there may be no change.

Following completion of the oil entrapment prevention strategy, at time $T_4$, the controller 88 issues instructions to the expansion devices 70, 72, 82 to close. At time $T_4$, the respective expansion devices 70, 72, 82 begin to close and return to their closed position by time $T_5$. If the speed of the compressor 64 increased at time $T_2$, the controller 88 may also instruct the compressor to reduce its speed. At time $T_4$, the speed may reduce and return to the same level as at time $T_1$. At time $T_5$, the controller 88 may resume the normal control strategy.

It should be understood that terms such as "generally," "substantially," and "about" are not intended to be boundaryless terms, and should be interpreted consistent with the way one skilled in the art would interpret those terms.

Although the different examples have the specific components shown in the illustrations, embodiments of this disclosure are not limited to those particular combinations. It is possible to use some of the components or features from one of the examples in combination with features or components from another one of the examples. In addition, the various figures accompanying this disclosure are not necessarily to scale, and some features may be exaggerated or minimized to show certain details of a particular component or arrangement.

One of ordinary skill in this art would understand that the above-described embodiments are exemplary and non-limiting. That is, modifications of this disclosure would come within the scope of the claims. Accordingly, the following claims should be studied to determine their true scope and content.

The invention claimed is:

1. A vehicle, comprising:
   a refrigerant system configured to circulate fluid relative to a first evaporator and a second evaporator arranged in parallel with the first evaporator, the fluid including a mixture of refrigerant and oil;
   a controller;
   a compressor responsive to instructions from the controller;
   a first electronic expansion valve upstream of the first evaporator and responsive to instructions from the controller; and
   a second electronic expansion valve upstream of the second evaporator and responsive to instructions from the controller, wherein the controller is configured to instruct the first and second electronic expansion valves to open based on an oil entrapment prevention strategy in series such that when one of the first and second electronic expansion valves is opened based the oil entrapment prevention strategy the other of the first and second electronic expansion valves is controlled based on a normal control strategy, and wherein, when either of the first or second electronic expansion valves is opened based on the oil entrapment prevention strategy, the controller is configured to instruct the compressor to continue operating.

2. The vehicle as recited in claim 1, wherein, when either of the first or second electronic expansion valves is opened based on the oil entrapment prevention strategy, the controller is configured to instruct the compressor to operate above a minimum threshold speed.

3. The vehicle as recited in claim 2, wherein the controller runs the oil entrapment prevention strategy by first issuing instructions to open the first electronic expansion valve based on the oil entrapment prevention strategy while the second electronic expansion valve is controlled based on the normal control strategy, and by next issuing instructions to open the second electronic expansion valve based on the oil entrapment prevention strategy while the first electronic expansion valve is controlled based on the normal control strategy.

4. The vehicle as recited in claim 1, wherein:
the refrigerant system includes at least one sensor,
the controller is configured to interpret signals from the at least one sensor to determine whether fluid exiting the first evaporator and the second evaporator is superheated,
the controller runs the oil entrapment prevention strategy by first issuing instructions to open the first electronic expansion valve based on the oil entrapment prevention strategy until the fluid exiting the first evaporator is superheated, and by next issuing instructions to open the second electronic expansion valve based on the oil entrapment prevention strategy until the fluid exiting the second evaporator is superheated.

5. The vehicle as recited in claim 4, wherein:
the at least one sensor includes a first temperature sensor and a first pressure sensor adjacent the first evaporator, and
the at least one sensor further includes a second temperature sensor and a second pressure sensor adjacent the second evaporator.

6. The vehicle as recited in claim 1, wherein the first evaporator is configured to thermally condition a front section of a vehicle cabin and the second evaporator is configured to thermally condition a rear section of the vehicle cabin.

7. The vehicle as recited in claim 6, wherein:
the refrigerant system includes a third evaporator in parallel with both the first evaporator and the second evaporator, and
the third evaporator is configured to thermally condition a battery pack of the vehicle.

8. The vehicle as recited in claim 7, wherein:
the refrigerant system includes a third electronic expansion valve upstream of the third evaporator,
when the controller instructs either the first or second electronic expansion valves to open based on the oil entrapment prevention strategy, the third electronic expansion valve is controlled based on the normal control strategy,
the controller is configured to instruct the third electronic expansion valve to open based on the oil entrapment prevention strategy while the first and second electronic expansion valves are controlled based on the normal control strategy, and
when the third electronic expansion valve is opened based on the oil entrapment strategy, the controller is configured to instruct the compressor to continue operating.

9. A method, comprising:
opening a first electronic expansion valve upstream of a first evaporator of a vehicle refrigerant system according to an oil entrapment prevention strategy to prevent entrapment of oil within the first evaporator while controlling a second electronic expansion valve upstream of a second evaporator of the vehicle refrigerant system based on a normal control strategy;
after the step of opening the first electronic expansion valve according to the oil entrapment prevention strategy, opening the second electronic expansion valve according to the oil entrapment prevention strategy to prevent entrapment of oil within the second evaporator while controlling the first electronic expansion valve based on the normal control strategy; and
operating a compressor of the vehicle refrigerant system above a minimum threshold speed when either of the first or second electronic expansion valves is opened based on the oil entrapment prevention strategy.

10. The method as recited in claim 9, wherein the compressor circulates fluid within the vehicle refrigerant system, the fluid including oil and refrigerant.

11. The method as recited in claim 9, wherein the opening and operating steps are performed for a predefined period of time and at predefined intervals.

12. The method as recited in claim 11, wherein the opening and operating steps are performed during the predefined period of time regardless of whether the normal control strategy would otherwise require opening either of the first or second electronic expansion valves or operating the compressor above the minimum threshold speed during the predefined period of time.

13. The method as recited in claim 9, wherein:
the step of opening the first electronic expansion valve according to the oil entrapment prevention strategy lasts until fluid exiting the first evaporator is superheated, and
the step of opening the second electronic expansion valve according to the oil entrapment prevention strategy lasts until fluid exiting the second evaporator is superheated.

14. The method as recited in claim 9, wherein the first evaporator is configured to thermally condition a front section of a vehicle cabin and a second evaporator is configured to thermally condition a rear section of the vehicle cabin.

15. The method as recited in claim 9, wherein:
the step of opening the first electronic expansion valve according to the oil entrapment prevention strategy lasts for between 15 and 30 seconds, and
the step of opening the second electronic expansion valve according to the oil entrapment prevention strategy lasts for between 15 and 30 seconds.

\* \* \* \* \*